United States Patent
Prather et al.

(10) Patent No.: US 7,255,804 B2
(45) Date of Patent: Aug. 14, 2007

(54) PROCESS FOR MAKING PHOTONIC CRYSTAL CIRCUITS USING AN ELECTRON BEAM AND ULTRAVIOLET LITHOGRAPHY COMBINATION

(75) Inventors: Dennis W. Prather, Landenberg, PA (US); Janusz Murakowski, Newark, DE (US)

(73) Assignee: University of Delaware, Newark, DE (US)

( * ) Notice: Subject to any disclaimer, the term of this patent is extended or adjusted under 35 U.S.C. 154(b) by 70 days.

(21) Appl. No.: 10/504,518

(22) PCT Filed: Feb. 14, 2003

(86) PCT No.: PCT/US03/04682
§ 371 (c)(1),
(2), (4) Date: Aug. 13, 2004

(87) PCT Pub. No.: WO03/071587
PCT Pub. Date: Aug. 28, 2003

(65) Prior Publication Data
US 2005/0164501 A1    Jul. 28, 2005

Related U.S. Application Data

(60) Provisional application No. 60/357,184, filed on Feb. 15, 2002.

(51) Int. Cl.
*G02B 6/00*    (2006.01)

(52) U.S. Cl. ............................ 216/24; 216/41; 216/49; 216/56; 216/75; 438/29; 430/269; 430/296; 430/321; 385/131; 359/237

(58) Field of Classification Search .................... None
See application file for complete search history.

(56) References Cited

U.S. PATENT DOCUMENTS 4,403,151 A * 9/1983 Mochiji et al. .......... 250/492.2

(Continued)

FOREIGN PATENT DOCUMENTS

JP    62-267740 A    11/1987

(Continued)

OTHER PUBLICATIONS

Cheng, C.C. et al "New fabrication techniques for high quality photonic crystals" JVST B 15(6) Nov./Dec. 1997, 2764-2767.*

(Continued)

*Primary Examiner*—Anita Alanko
(74) *Attorney, Agent, or Firm*—Connolly Bove Lodge & Hutz, LLP

(57) ABSTRACT

A process for making photonic crystal circuit and a photonic crystal circuit consisting of regularly-distributed holes in a high index dielectric material, and controllably-placed defects within this lattice, creating waveguides, cavities, etc. for photonic devices. The process is based upon the discovery that some positive ultraviolet (UV) photoresists are electron beam sensitive and behave like negative electron beam photoresists. This permits creation of photonic crystal circuits using a combination of electron beam and UV exposures. As a result, the process combines the best features of the two exposure methods: the high speed of UV exposure and the high resolution and control of the electron beam exposure. The process also eliminates the need for expensive photomasks.

19 Claims, 2 Drawing Sheets

U.S. PATENT DOCUMENTS

| | | | |
|---|---|---|---|
| 4,496,216 A | | 1/1985 | Cowan |
| 5,104,772 A | | 4/1992 | Kobayashi et al. |
| 5,328,560 A | | 7/1994 | Hanawa et al. |
| 6,051,659 A | * | 4/2000 | Merritt et al. ............... 525/354 |
| 6,337,163 B1 | * | 1/2002 | Sato ........................... 430/30 |
| 6,541,182 B1 | * | 4/2003 | Louis Joseph Dogue et al. .......................... 430/296 |
| 6,671,097 B2 | * | 12/2003 | Fink et al. .................. 359/586 |
| 6,875,624 B2 | * | 4/2005 | Lin ............................ 438/16 |
| 6,917,744 B2 | * | 7/2005 | Koyama .................... 385/131 |
| 2003/0087191 A1 | * | 5/2003 | Lavallee et al. ............ 430/296 |
| 2005/0064343 A1 | * | 3/2005 | Romanato et al. .......... 430/312 |
| 2005/0117843 A1 | * | 6/2005 | Catchmark et al. ........... 385/37 |
| 2006/0099534 A1 | * | 5/2006 | Murakowski et al. ....... 430/322 |

FOREIGN PATENT DOCUMENTS

| | | |
|---|---|---|
| JP | 62267740 A * | 11/1987 |
| WO | WO-99/09439 A1 | 2/1999 |
| WO | WO 01/22133 A1 | 3/2001 |
| WO | WO 200122133 A1 * | 3/2001 |

OTHER PUBLICATIONS

Yamamoto, n et al "100-nm-Scale Alignment using laser beam diffraction pattern observation techniques and wafer fusion for realizing three-dimensional photonic crystal structure" Jpn. J. Appl. Phys. vol. 37 pp. 3334-3338. Part 1, No. 6A, Jun. 1998.*

Happ, T.D. et al "Nanofabrication fo two-dimensional photonic crystal mirrors for 1.5 um short cavity lasers" JVST B 19(6) Nov./Dec. 2001, 2775-2778.*

Schneider, G.J. et al "Combination lithography for photonic-crystal circuits" JVST B 22(1) Jan./Feb. 2004, 146-151.*

U.S. Appl. No. 60/307,908, filed Jul. 26, 2001 by J.M. Catchmark et al.*

E. Yablonovich, "Inhibited spontaneous emission in solid-state physics and electronics," *Physical Review Letters*, vol. 58, No. 20, pp. 2059-2062 (May 1987).

S. John, "Strong localization of photons in certain disordered dielectric Superlattices," *Physical Review Letters*, vol. 58, No. 23, pp. 2486-2489 (Jun. 1987).

* cited by examiner

PROCESS FOR MAKING PHOTONIC CRYSTAL CIRCUITS USING AN ELECTRON BEAM AND ULTRAVIOLET LITHOGRAPHY COMBINATION

CROSS-REFERENCE TO RELATED APPLICATIONS AND CLAIM FOR PRIORITY

The present application is a U.S. National Stage application filed under 35 U.S.C. § 371, claiming priority of International application No. PCT/US03/04682, filed Feb. 14, 2003, and U.S. Provisional Patent Application Ser. No. 60/357,184, filed Feb. 15, 2002, under 35 U.S.C. §§ 119 and 365, the disclosures of the above-referenced applications being incorporated by reference herein in their entireties.

BACKGROUND OF THE INVENTION

A. Field of the Invention

The present invention relates generally to photonic crystals, and, more particularly to a process for making photonic crystal circuits using an electron beam and ultraviolet lithography combination.

B. Description of the Related Art

During the last decade photonic crystals (also known as photonic band gap or PBG materials) have risen from a relatively obscure technology to a prominent field of research. In large part this is due to their unique ability to control, or redirect, the propagation of light. E. Yablonovich, "Inhibited spontaneous emission in solid-state physics and electronics," *Physical Review Letters*, vol. 58, pp. 2059-2062 (May 1987), and S. John, "Strong localization of photons in certain disordered dielectric superlattices," *Physical Review Letters*, vol. 58, pp. 2486-2489 (June 1987), initially proposed the idea that a periodic dielectric structure can possess the property of a band gap for certain frequencies in the electromagnetic spectra, in much the same way as an electronic band gap exists in semiconductor materials. This property affords photonic crystals with a unique ability to guide and filter light as it propagates within it. In this way, photonic crystals have been used to improve the overall performance of many opto-electronic devices.

The concept of a photonic band gap material is as follows. In direct conceptual analogy to an electronic band gap in a semiconductor material, which excludes electrical carriers having stationary energy states within the band gap, a photonic band gap in a dielectric medium excludes stationary photonic energy states (i.e., electromagnetic radiation having some discrete wavelength or range of wavelengths) within a certain energy range or corresponding frequency range. In semiconductors, the electronic band gap is a consequence of having a periodic atomic structure which interacts with an electron behaving quantum-mechanically as a wave. This interaction gives rise to a forbidden range of energy levels, the so called electronic band gap. By analogy, the photonic band gap results if one has a periodically structured material, where the periodicity is of a distance suitable to interact with an electromagnetic wave of some characteristic wavelength, in such a way as to create a band of frequencies that are forbidden to exist within the material, the so called photonic band gap.

An envisioned use of these materials is the optical analog to semiconductor behavior, in which a photonic band gap material, or a plurality of such materials acting in concert, can be made to interact with and control light wave propagation in a manner analogous to the way that semiconductor materials can be made to interact with and control the flow of electrically charged particles, i.e., electricity, in both analog and digital electronic applications.

Planar photonic crystal circuits such as splitters, high Q-microcavities, and multi-channel drop/add filters have been investigated both theoretically and experimentally in both two- and three-dimensional photonic crystal structures. For two-dimensional photonic crystal structures, the photonic crystal consists of either an array of low index cylinders surrounded by a background material of sufficiently higher index or, an array of high index cylinders surrounded by a background material of sufficiently lower index. In both cases, in-plane confinement is achieved through multiple Bragg reflections that occur due to the presence of the material lattice, which represents the photonic crystal. For some three-dimensional photonic crystal structures, namely those that consist of a two-dimensional structure, or lattice, that are finite in height, confinement in the vertical direction is achieved through total internal reflection (TIR). In either case the main limiting factor in the wide spread use of these devices is the ability to get light into and out of these structures. For this reason, optical coupling structures have a pronounced impact on the operation of any photonic integrated circuit ("PIC").

In addition, whereas the lithography methods developed in the microelectronic industry have been successfully applied to fabricating small photonic crystal circuits, these methods are far from optimum for this purpose. For example, patterning a square centimeter of photonic crystal circuit for the near infrared wavelength requires exposing approximately 500 million circles. While not impossible, this is certainly strenuous for current lithography tools. Moreover, while slight variation in feature size is acceptable for electronic circuits, the tolerances in case of photonic crystal circuits are far more stringent for even small variation of hole sizes may compromise the performance of photonic crystal circuits.

Thus, there is a need in the art for an improved process for making photonic crystal circuits.

SUMMARY OF THE INVENTION

The present invention addresses the needs of the art by providing a process for making planar photonic crystal circuits consisting of regularly-distributed holes in a high index dielectric material, and controllably-placed defects within this lattice, permitting formation of waveguides, cavities, etc. for creating photonic devices. The process of the present invention is based on the discovery that some positive ultraviolet (UV) photoresists are electron beam ("e-beam") sensitive and behave like negative e-beam photoresists. This permits creation of photonic crystal circuits using a combination of electron beam and UV exposures.

In accordance with the purpose of the invention, as embodied and broadly described herein, the invention comprises a process for making a photonic crystal circuit, comprising: depositing an ultraviolet positive, electron beam negative photoresist layer on a substrate; patterning defects into portions of the photoresist layer by exposing the portions of the photoresist layer to an electron beam; exposing the photoresist layer to ultraviolet radiation; and chemically developing the photoresist layer with a developer, wherein the developer dissolves areas of the photoresist layer exposed to the ultraviolet radiation and unexposed to the electron beam to produce a pattern of holes in the photoresist layer.

Further in accordance with the purpose of the invention, as embodied and broadly described herein, the invention comprises a photonic crystal circuit, comprising: a substrate; and an ultraviolet positive, electron beam negative photoresist layer deposited on the substrate, wherein defects are patterned into portions of the photoresist layer by exposing the portions of the photoresist layer to an electron beam, the photoresist layer is exposed to ultraviolet radiation, and areas of the photoresist layer exposed to the ultraviolet radiation and unexposed to the electron beam are chemically developed to produce a pattern of holes in the photoresist layer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description. It is to be understood that both the foregoing general description and the following detailed description are exemplary and explanatory only and are not restrictive of the invention, as claimed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF EMBODIMENTS OF THE INVENTION

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

The present invention is drawn to a process for making photonic bandgap (PBG) structures (or photonic crystal circuits) consisting of regularly-distributed holes in a high index dielectric material, and controllably-placed defects within this lattice, creating waveguides, cavities, etc. for photonic devices. The process of the present invention is based upon the discovery by the present inventors that some positive ultraviolet (UV) photoresists, such as, for example, an AZ 5200 series photoresist sold by Clariant International, Ltd., are electron beam sensitive and behave like negative e-beam photoresists. This permits creation of photonic crystal circuits using a combination of electron beam and UV exposures. As a result, the process of the present invention combines the best features of the two exposure methods: the high speed of UV exposure and the high resolution and control of the electron beam exposure.

Figure 1A:
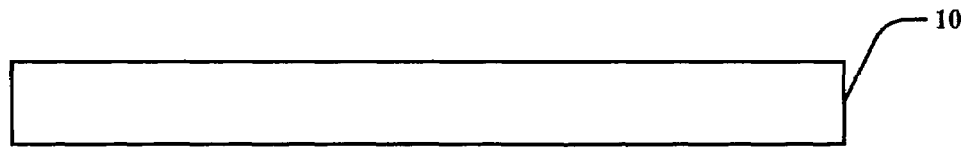
FIGS. 1(a)-1(g) are schematic diagrams showing the steps of a process for making a photonic crystal circuit in accordance with an embodiment of the present invention.
Figure 1B:
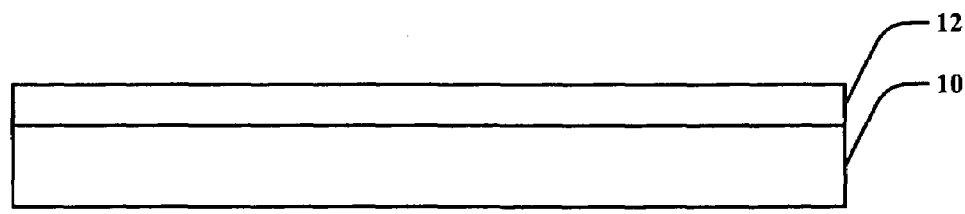

FIGS. 1(a)-1(g) depict the process of making or patterning a photonic crystal circuit in accordance with an embodiment of the present invention. In a first step of the process, as shown in FIGS. 1(a) and 1(b), a UV-positive, e-beam negative photoresist layer 12 may be deposited on a substrate 10 by spinning a liquid solution of the photoresist and then evaporating the solvent of the liquid photoresist solution. Substrate 10 may be a silicon-on-insulator ("SOI"), insulator, silicon, etc. type of substrate. Photoresist layer 12 may comprise any type of UV-positive, e-beam negative type of photoresist, such as, for example, the AZ 5200 series photoresist discussed above.

Figure 1C:
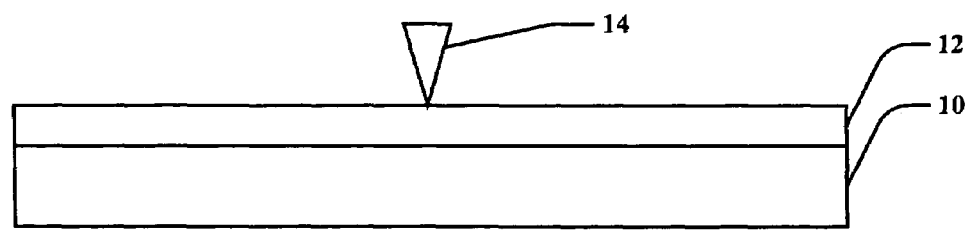

In a second step of the process of the present invention, defects such as waveguides, cavities, etc., are patterned in photoresist layer 12 using an electron beam 14 as shown in FIG. 1(c). A portion of photoresist layer 12 modified by the e-beam 14 exposure is indicated by reference numeral 16 in FIG. 1(d). However, multiple portions 16 of photoresist layer 12 may be modified by e-beam 14. Electron beam 14 may emanate from any conventional electron beam equipment.

Figure 1D:
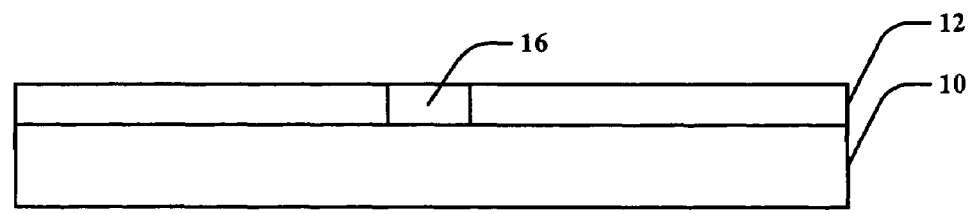
Figure 1E:
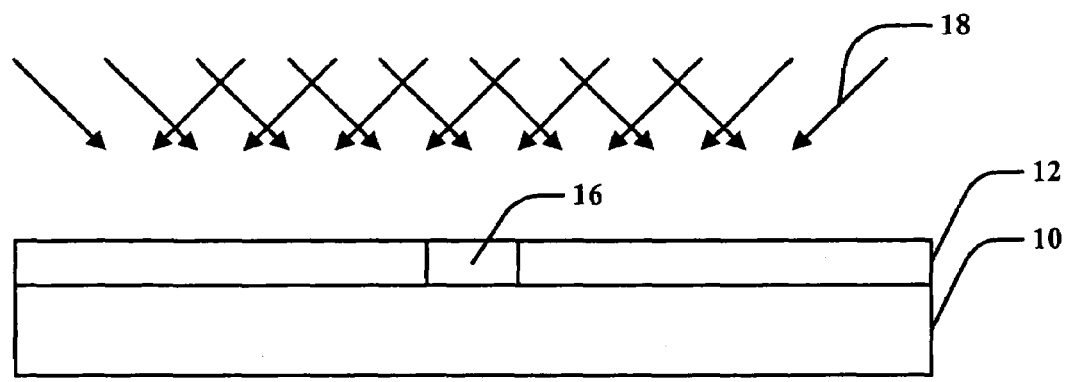

In a third step of the process of the present invention, the structure of FIG. 1(d), i.e., substrate 10, photoresist layer 12, and the e-beam modified portion 16 of photoresist layer 14, is exposed with an interference pattern from coherent sources of ultraviolet radiation 18, as shown in FIG. 1(e). For example, three coherent sources of ultraviolet radiation 18 can create a triangular lattice of bright spots, or antinodes of the interference pattern, in photoresist layer 12. Ultraviolet radiation 18 may emanate from any conventional coherent ultraviolet radiation source.

Figure 1F:
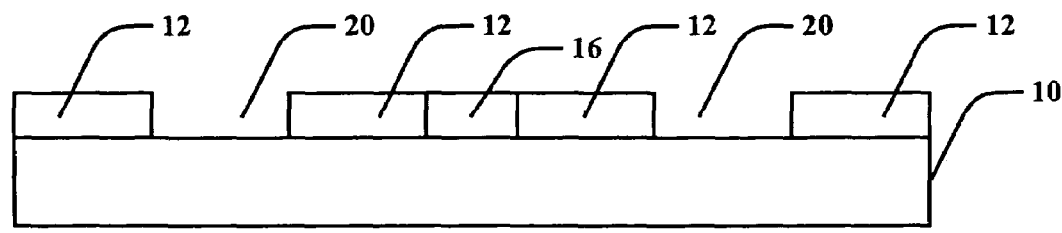

In the last step of the process of the present invention, photoresist layer 12 is chemically developed with a developer, as shown in FIG. 1(f). The developer may be any conventional type of developer used to develop the specific photoresist chosen for photoresist layer 12 such as, for example, a Microposit 327 MIF developer (generically referred to as tetramethylammonium hydroxide). The developer dissolves areas of photoresist layer 12 that were exposed to ultraviolet radiation 18 (i.e., bright spots or antinodes of the interference pattern) and unexposed to electron beam 14. Areas of photoresist layer 14 unexposed to ultraviolet radiation 18 or exposed to electron beam 14 remain intact, as shown in FIG. 1(f). This produces a pattern or a regular grid of holes 20 corresponding to the antinodes of the interference patterns produced by ultraviolet radiation 18 and unexposed to electron beam 14.

Figure 1G:
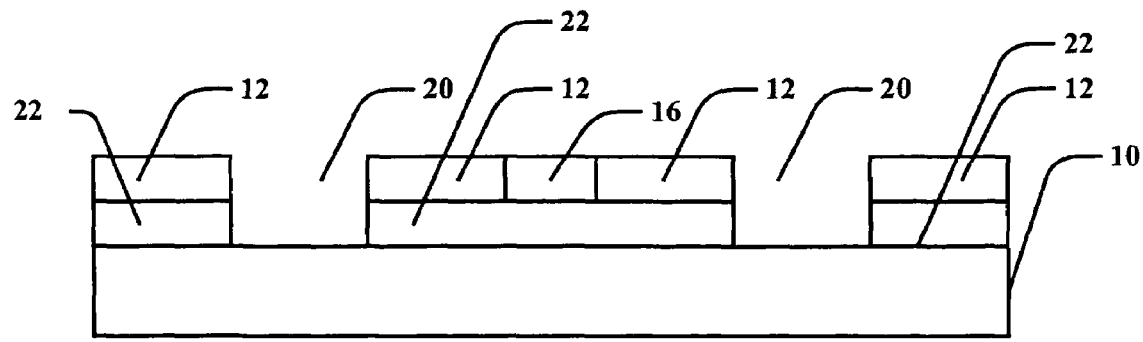

The pattern of holes 20 in photoresist layer 14 may then be transferred to the underlying substrate 10 using standard etching techniques. Alternatively, a metal layer 22 may be formed under photoresist layer 12 in the case of maskmaking. In which case, the pattern of holes 20 would be extended through metal layer 22 using standard metal etching techniques, as shown in FIG. 1(g).

The process of the present invention provides several advantages over conventional techniques since it exploits the best features of UV and electron beam lithography. UV lithography is suitable for large area fast exposure. Moreover, by using an interference pattern in the UV exposure, the process of the present invention eliminates the use of photomasks, which provides major cost savings since photomasks are expensive to manufacture. The electron beam exposure allows for very high resolution patterning, but is not suitable for a large area since it is a serial, and thus relatively slow, process. However, in the process of the present invention the electron beam is used only to expose specific defects within the structure. Thus, the patterning time is significantly reduced as compared to what would be required had the entire structure been exposed to an electron beam.

It will be apparent to those skilled in the art that various modifications and variations can be made in the process for making photonic crystal circuits using an electron beam and ultraviolet lithography combination of the present invention and in construction of the process without departing from the scope or spirit of the invention. As an example, the primary application of the process of the present invention is the fabrication of photonic crystal-based circuits. However, the process of the present invention could also be used for patterning electronic circuits containing repeatable cells in addition to non-repeatable structures, such as, for example, computer memory or programmable gate arrays. In this case, the repeatable structures would be patterned with the interference pattern of the UV beams, possibly involving numerous coherent beams, whereas the unique patterns would be written with the e-beam. Furthermore, the process of the present invention may also be used to pattern a photolithography mask rather than for direct exposure, thereby greatly reducing the cost of mask making.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A process for making a photonic crystal circuit, comprising:
   depositing an ultraviolet positive, electron beam negative photoresist layer on a substrate;
   patterning defects into portions of the photoresist layer by exposing the portions of the photoresist layer to an electron beam;
   exposing the photoresist layer to an interference pattern resulting from coherent sources of ultraviolet radiation; and
   chemically developing the photoresist layer with a developer, wherein the developer dissolves areas of the photoresist layer exposed to the ultraviolet radiation and unexposed to the electron beam.

2. A process for making a photonic crystal circuit as recited in claim 1, wherein the substrate comprises a silicon-on-insulator substrate.

3. A process for making a photonic crystal circuit as recited in claim 1, wherein the depositing of the photoresist layer comprises spinning a liquid solution of the photoresist on the substrate and evaporating a solvent from the liquid solution.

4. A process for making a photonic crystal circuit as recited in claim 1, wherein the photoresist layer is a propyleneglycol monomethyl ether acetate formulated photoresist.

5. A process for making a photonic crystal circuit as recited in claim 1, wherein the photonic crystal circuit comprises regularly distributed holes and a controlled pattern of defects.

6. A process for making a photonic crystal circuit as recited in claim 5, wherein three coherent sources of ultraviolet radiation are used to create a triangular lattice of antinodes of the interference pattern in the photoresist layer.

7. A process for making a photonic crystal circuit as recited in claim 6, wherein the pattern of holes correspond to the antinodes of the interference pattern formed in the photoresist layer and the areas of the photoresist layer unexposed to the electron beam.

8. A process for making a photonic crystal circuit as recited in claim 1, wherein the developer comprises a tetramethylammonium hydroxide.

9. A process for making a photonic crystal circuit as recited in claim 1, further comprising transferring the pattern of holes to the substrate by etching the substrate.

10. A process for making a photonic crystal circuit as recited in claim 1, farther comprising, prior to the depositing the photoresist layer, depositing a metal layer on the substrate.

11. A process for making a photonic crystal circuit as recited in claim 10, further comprising transferring the pattern of holes to the metal layer by etching the metal layer.

12. A photonic crystal circuit made by the process of claim 1.

13. A photonic crystal circuit as recited in claim 12, wherein the substrate comprises a silicon-on-insulator substrate.

14. A photonic crystal circuit as recited in claim 12, wherein the photoresist layer is a propyleneglycol monomethyl ether acetate formulated photoresist.

15. A photonic crystal circuit as recited in claim 12, wherein a triangular lattice of antinodes of an interference pattern are created in the photoresist layer with the ultraviolet radiation.

16. A photonic crystal circuit as recited in claim 15, wherein the pattern of holes correspond to the antinodes of the interference pattern formed in the photoresist layer and the areas of the photoresist layer unexposed to the electron beam.

17. A photonic crystal circuit as recited in claim 12, wherein the pattern of holes is transferred to the substrate by etching the substrate.

18. A photonic crystal circuit as recited in claim 12, further comprising a metal layer disposed between the substrate and the photoresist layer.

19. A photonic crystal circuit as recited in claim 18, wherein the pattern of holes is transferred to the metal layer by etching the metal layer.

* * * * *